United States Patent
Liu

(10) Patent No.: US 11,854,797 B2
(45) Date of Patent: Dec. 26, 2023

(54) METHODS FOR MANUFACTURING SEMICONDUCTOR MEMORY

(71) Applicant: CHANGXIN MEMORY TECHNOLOGIES, INC., Anhui (CN)

(72) Inventor: Haodong Liu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 224 days.

(21) Appl. No.: 17/310,529

(22) PCT Filed: Feb. 8, 2021

(86) PCT No.: PCT/CN2021/076090
§ 371 (c)(1),
(2) Date: Aug. 6, 2021

(87) PCT Pub. No.: WO2021/164622
PCT Pub. Date: Aug. 26, 2021

(65) Prior Publication Data
US 2022/0328307 A1    Oct. 13, 2022

(30) Foreign Application Priority Data
Feb. 20, 2020   (CN) .......................... 202010105005.6

(51) Int. Cl.
*H01L 21/02*    (2006.01)
(52) U.S. Cl.
CPC .. *H01L 21/02244* (2013.01); *H01L 21/02175* (2013.01); *H01L 21/02252* (2013.01); *H01L 21/02334* (2013.01)

(58) Field of Classification Search
None
See application file for complete search history.

(56) References Cited

U.S. PATENT DOCUMENTS

| 5,716,535 A | 2/1998 | Lee et al. |
| 6,001,718 A | 12/1999 | Katata et al. |
| 6,461,939 B1 | 10/2002 | Furihata et al. |

(Continued)

FOREIGN PATENT DOCUMENTS

| CN | 104282619 A | 1/2015 |
| CN | 106992177 A | 7/2017 |

(Continued)

OTHER PUBLICATIONS

Machine language translation of JP-60163466-A.*

(Continued)

*Primary Examiner* — Erik Kielin
(74) *Attorney, Agent, or Firm* — SYNCODA LLC; Feng Ma

(57) ABSTRACT

A method for manufacturing a semiconductor memory includes: providing a portion to be processed, and performing a preset process step on the portion to be processed at least after a minimum waiting time; before performing the preset process step, performing a thermal oxidation process on the portion to be processed; and before performing the preset process step, performing a cleaning process, the cleaning process being used to remove oxides from the surface of the portion to be processed, the oxides being wholly or partly generated by the thermal oxidation process.

9 Claims, 4 Drawing Sheets

(56) References Cited

U.S. PATENT DOCUMENTS

| | | |
|---|---|---|
| 10,151,048 B1 | 12/2018 | Wu et al. |
| 10,153,284 B2 | 12/2018 | Kang et al. |
| 10,186,602 B2 | 1/2019 | Chen et al. |
| 10,784,355 B2 | 9/2020 | Xue et al. |
| 2002/0137296 A1 | 9/2002 | Satoh et al. |
| 2009/0078993 A1 | 3/2009 | Fujimoto |
| 2009/0233453 A1 | 9/2009 | Mani et al. |
| 2009/0275183 A1 | 11/2009 | Mine et al. |
| 2011/0266615 A1 | 11/2011 | Oyu et al. |
| 2017/0229460 A1 | 8/2017 | Czornomaz et al. |
| 2021/0066064 A1* | 3/2021 | Ren ............... H01L 21/02068 |

FOREIGN PATENT DOCUMENTS

| | | | | | |
|---|---|---|---|---|---|
| CN | 107316808 A | | 11/2017 | | |
| CN | 110783193 A | | 2/2020 | | |
| JP | 60163466 A | * | 8/1985 | ............ | H01L 29/78 |
| JP | H0621214 A | | 1/1994 | | |
| JP | 2010016039 A | * | 1/2010 | | |
| JP | 2014192245 A | * | 10/2014 | ........ | H01J 37/32449 |
| KR | 20070033694 A | | 3/2007 | | |

OTHER PUBLICATIONS

Machine language translation of JP-2010016039-A.*
Machine language translation of JP-2014192245-A.*
China first office action in Application No. 202010105005.6, dated May 10, 2022.
International Search Report in Application No. PCT/CN2021/076090, dated Apr. 23, 2021.

* cited by examiner

METHODS FOR MANUFACTURING SEMICONDUCTOR MEMORY

CROSS-REFERENCE TO RELATED APPLICATIONS

This application is a national stage of International Application No. PCT/CN2021/076090 filed on Feb. 8, 2021, which claims priority to Chinese Patent Application No. 202010105005.6 filed on Feb. 20, 2020. The disclosures of these applications are hereby which is incorporated by reference in their entirety.

TECHNICAL FIELD

The present application relates to the field of semiconductors, and in particular, to a method for manufacturing a semiconductor memory.

BACKGROUND

In the prior art, complex fine structures are usually manufactured in an automated and streamlined manner. An initial part needs to go through multiple process steps to form a finished or semi-finished product that meets the predetermined requirements.

Since the multiple process steps are usually performed continuously, the finished part formed in a previous process step will be subjected to a next process step as an initial part. At present, it is usually assumed that the performance parameters of the finished part formed in a previous process step are the same as the performance parameters of the initial part for a next process step, or the part is simply treated before a next process step.

The existing treatment process method needs to be improved.

SUMMARY

Some embodiments of the present application provide a method for manufacturing a semiconductor memory, which is helpful to the improvement to uniformity of oxides on the surface of the portion to be processed and avoids damages to the portion to be processed by the cleaning process, thereby improving the performance of the semiconductor memory.

In order to solve the above problems, some embodiments of the present application provide a method for manufacturing a semiconductor memory, comprising: providing a portion to be processed, and performing a preset process step on the portion to be processed at least after a minimum waiting time; before performing the preset process step, performing a thermal oxidation process on the portion to be processed; and before performing the preset process step, performing a cleaning process, the cleaning process being used to remove oxides from the surface of the portion to be processed, the oxides being wholly or partly generated by the thermal oxidation process.

In addition, the thermal oxidation process is performed by using oxygen plasma. In this way, it is helpful to improve the process rate of the thermal oxidation process and shorten the time required for the thermal oxidation process.

In addition, a first radio frequency power range for generating the oxygen plasma is from 3500 W to 4400 W.

In addition, a process temperature for the thermal oxidation process is from 60° C. to 120° C. In this way, it is helpful to prevent the thermal oxidation process from affecting the performance of the portion to be processed.

In addition, the thermal oxidation process comprises: heating the portion to be processed, so that the temperature of the portion to be processed increases to a first temperature, wherein a first pressure is formed in a reaction chamber during the heating process; after the heating process, maintaining the temperature of the portion to be processed at the first temperature, and providing an oxygen supply gas so that the pressure in the reaction chamber increases from the first pressure to a second pressure; and after the pressure in the reaction chamber increases to the second pressure, turning on a radio frequency power supply.

In addition, the second pressure is from 900 Torr to 1500 Torr. In this way, it is helpful to increase the process rate of the thermal oxidation process.

In addition, after the heating process, the oxygen supply gas and a catalytic gas are provided; wherein the oxygen supply gas is $O_2$ and the flow rate of the oxygen supply gas is 13000 sccm, and the catalytic gas is $N_2H_4$ and the flow rate of the catalytic gas is 1300 sccm. In this way, it is helpful to further increase the process rate of the thermal oxidation process.

In addition, the cleaning process comprises: providing the oxygen supply gas, and adjusting the temperature of the portion to be processed, the pressure in the reaction chamber, and the power of the radio frequency power supply so that the temperature of the portion to be processed decreases to a second temperature, the pressure in the reaction chamber decreases to a third pressure, and the power of the radio frequency power supply decreases to a second radio frequency power; and after the adjustment, maintaining the pressure in the reaction chamber at the third pressure, and replacing part of the oxygen supply gas with a reaction gas, the reaction gas being used to remove the oxides. In this way, it is helpful to ensure the stability of the pressure in the reaction chamber.

In addition, the material for the portion to be processed comprises tungsten, the oxides are tungsten oxide, the oxygen supply gas comprises $O_2$ or $O_3$, and the reaction gas comprises a fluorine-containing gas or ammonia gas.

In addition, the oxygen supply gas is oxygen and the flow rate of the oxygen supply gas is 3960 sccm; and the reaction gas is $CF_4$ and the flow rate of the reaction gas is 40 sccm.

In addition, after performing the cleaning process and before performing the preset process step, a purging process is performed, the purging process comprises: purging the surface of the portion to be processed with an inert gas, the difference between the temperature of the inert gas and the second temperature being less than a preset temperature value. In this way, it is helpful to avoid a large difference between the temperature of the inert gas and the temperature of the portion to be processed, and then to avoid damages, such as explosion, that may be caused by a large temperature difference, thereby ensuring the good performance of the portion to be processed.

Compared with the prior art, the technical schemes provided by the embodiments of the present application have the following advantages.

In the above technical schemes, before performing the preset process step, a thermal oxidation process is performed on the portion to be processed, so that oxides, which are uniform in thickness and compact, are generated on the surface of the portion to be processed. Since the oxides are quite compact, it can protect the portion to be processed and prevent the portion to be processed from being further oxidized before the cleaning process. In addition, since the oxides on the surface of the portion to be processed are uniform in thickness, the oxides can be removed by controlling the progress of the cleaning process without damaging the portion to be processed.

BRIEF DESCRIPTION OF THE DRAWINGS

One or more embodiments will be exemplified by pictures in the corresponding drawings. These exemplified descriptions do not constitute any limitation to the embodiments. Elements with the same reference numerals in the drawings are represented as similar. Unless otherwise stated, the drawings are not necessarily drawn to scale.

DETAILED DESCRIPTION

At present, in the process of manufacturing a semiconductor memory, a portion to be processed needs to go through multiple process stations in sequence, each of which is used to perform at least one process step. There is a preset waiting time between adjacent process stations, that is, after a corresponding process step is performed on the portion to be processed at a previous process station, the portion to be processed needs to wait for the preset waiting time before entering a next process station.

Figure 1:
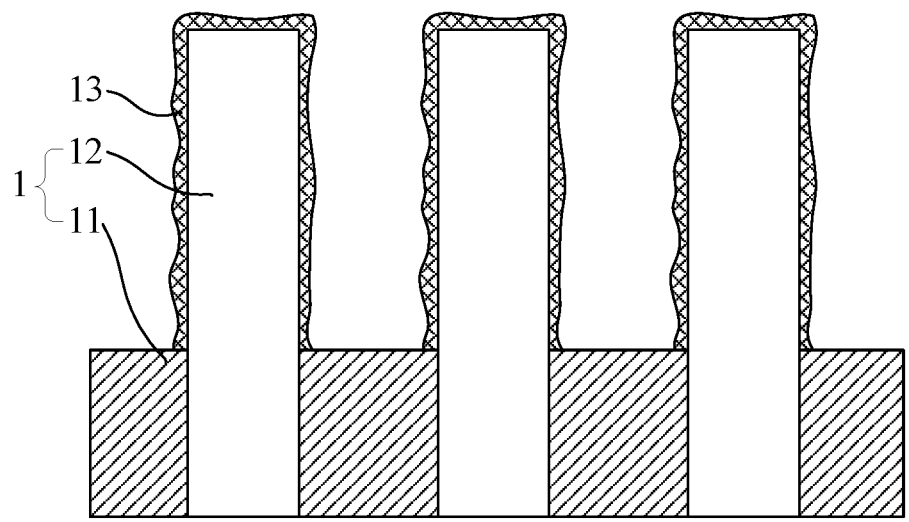
FIG. 1 is a schematic cross-sectional view of a portion to be processed.

During the preset waiting time, the portion to be processed is usually exposed to air environment. As a result, metal materials in the portion to be processed, without any isolation from air, may be naturally oxidized due to their exposure to oxygen. Referring to FIG. 1, the portion to be processed 1 comprises a substrate 11 and a plurality of discrete gate structures 12. The substrate 11 is a wafer. The gate structure 12 contains metal materials without any isolation from air. An oxide layer 13 is oxides generated by the natural oxidization of the metal materials in the gate structure 12. Due to the poor protection by the oxide layer 13, the gate structure 12 cannot be protected effectively. Furthermore, the oxide layer 13 is not stable since its generation highly depends upon environmental factors and time factors. Therefore, it is necessary to remove the oxide layer 13 before the portion to be processed 1 enters a next process station.

It should be noted that the oxide layer 13 has certain uniformity. The uniformity refers to the difference in thickness of metal oxides in different regions of the gate structure 12. The smaller the difference, the better the uniformity. The uniformity of the oxide layer 13 is related to the time that the gate structure 12 is exposed to air environment. The shorter the exposure time, the worse the uniformity, that is, the shorter the preset waiting time between adjacent process stations, the worse the uniformity of the oxide layer 13.

Thus, when the preset waiting time is relatively short, during the removal of the oxide layer 13, due to the different thickness of the oxide layer 13 in different regions of the gate structure 12, the time required for the removal of the oxide layer 13 in different regions is different. In a case where the oxide layer 13 in a certain region has been removed, the process of removing the oxide layer 13 cannot be stopped since the oxide layer 13 in other regions has not been completely removed, and the continued removal operation may act on the gate structure 12 which is exposed because the oxide layer 13 in that region has been removed, while removing the oxide layer 13 in other regions, thereby causing damages to the gate structure 12.

In addition, at present, the portions to be processed are often cleaned one by one by a wet etching process. However, the wet etching process may cause other problems in the process of removing the oxide layer 13. Examples are as follows.

Figure 2:
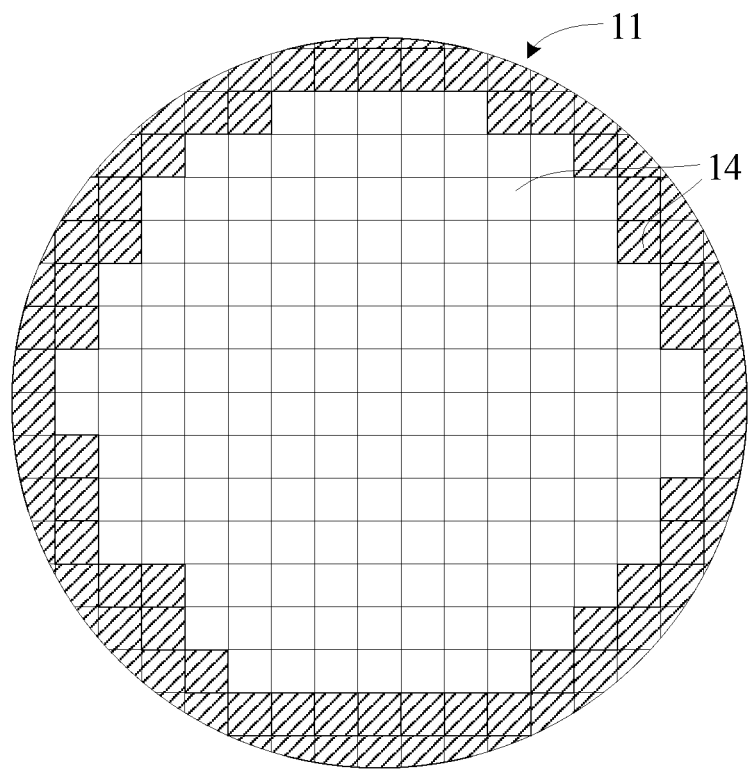
FIG. 2 is a top plan view of the portion to be processed.

Referring to FIGS. 1 and 2, in the wet etching process, usually, an etching solution 14 is uniformly coated by a spin coating method. However, due to the centrifugal force during rotation, the etching solution 14 always tends to flow away from the center of the wafer. As a result, after the coating is completed, the amount of the etching solution 14 at the edge of the wafer is greater than the amount of the etching solution 14 at the center of the wafer. Consequently, in the process of etching the oxide layer 13, after the oxide layer 13 at the edge of the wafer is removed by etching, there will still be some residual etching solution. The residual etching solution 14 will act on the gate structure 12, to affect the performance of the gate structure 12.

Figure 3:
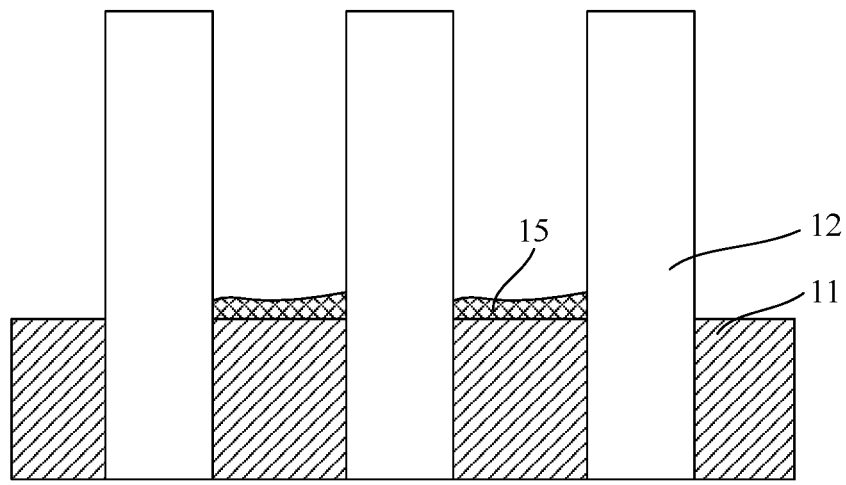
FIG. 3 is another schematic cross-sectional view of the portion to be processed.

In addition, referring to FIGS. 1 and 3, in the wet etching process, usually, the etching solution and other impurities are thrown away by rotating, after the etching is completed. When the depth of the groove between adjacent gate structures 12 is large, the centrifugal force during rotation is insufficient to completely remove the substance at the bottom of the groove between the adjacent gate structures 12. Impurities 15, which are to be removed, remain at the bottom of the groove between the adjacent gate structures 12 after drying the portion 1 to be processed and preparing it for the subsequent processing steps.

Taking, as an example, the metal material in the gate structure 12 as tungsten and the oxide layer 13 as tungsten oxide, usually, the tungsten oxide is pre-cleaned and wet with diluted hydrofluoric acid and then etched with aqueous ammonia. As a result, the impurities 15, which are to be removed, usually contain tungsten oxide that directly fell off instead of being etched and substances such as ammonium tungstate resulted from the reaction. Tungsten oxide is a semiconductor material. When the manufactured semiconductor memory is powered on, the presence of the impurities 15, which are to be removed, may cause a short circuit of the adjacent gate structures 12, thereby affecting the performance of the semiconductor memory.

In order to solve the above problems, an embodiment of the present application provides a method for manufacturing a semiconductor memory, comprising: providing a portion to be processed, and performing a preset process step on the portion to be processed at least after a minimum waiting time; before performing the preset process step, performing a thermal oxidation process on the portion to be processed; and before performing the preset process step, performing a cleaning process, the cleaning process being used to remove oxides from the surface of the portion to be processed, the oxides being wholly or partly generated by the thermal oxidation process.

To make the objectives, technical schemes and advantages of the embodiments of the present application clearer, the implementations of the present application will be further described below in detail with reference to the accompanying drawings. It may be understood by a person of ordinary skill in the art that, in the embodiments of the present application, many technical details are provided for the better understanding of the present application. However, the technical schemes sought to be protected by the present application can be implemented, even without these technical details and various changes and modifications based on the following embodiments.

Figure 4:
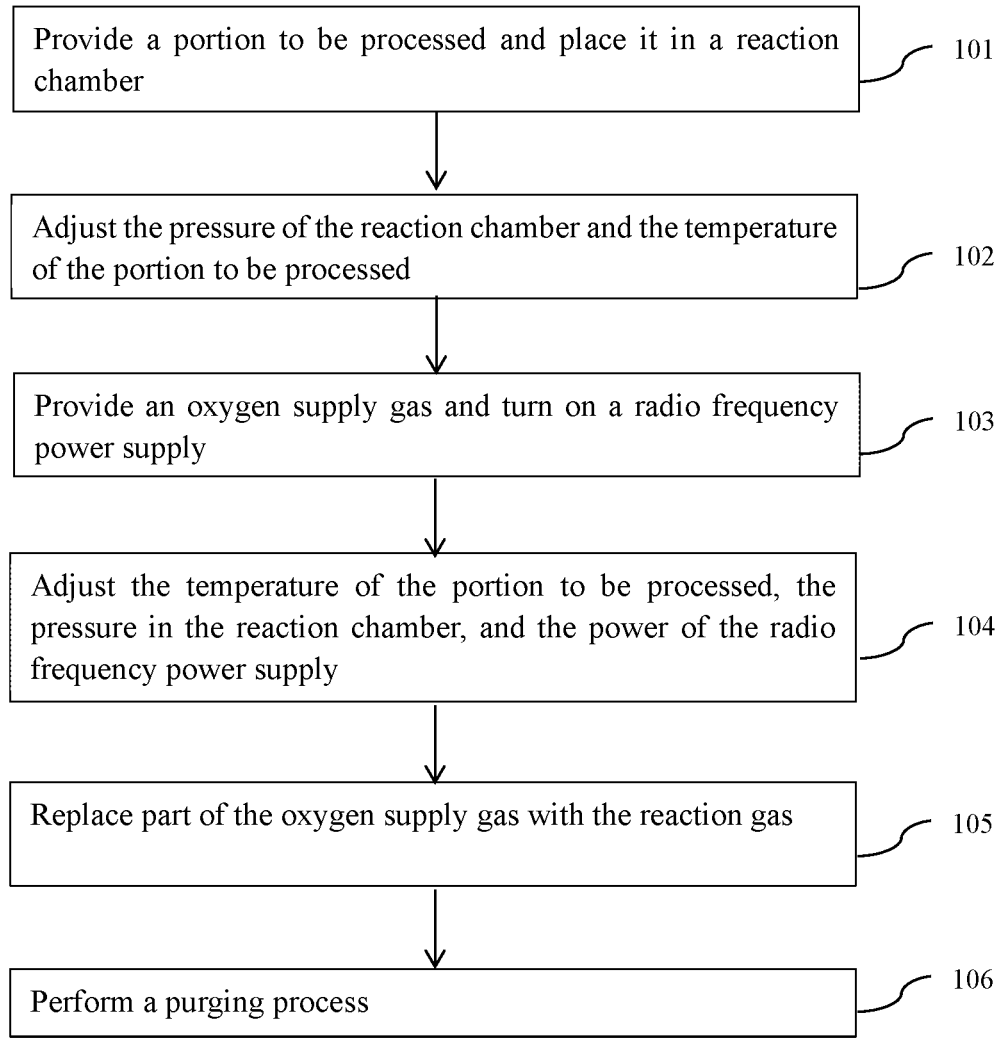
FIG. 4 is a flowchart of a method for manufacturing a semiconductor memory according to an embodiment of the present application.
Figure 5:
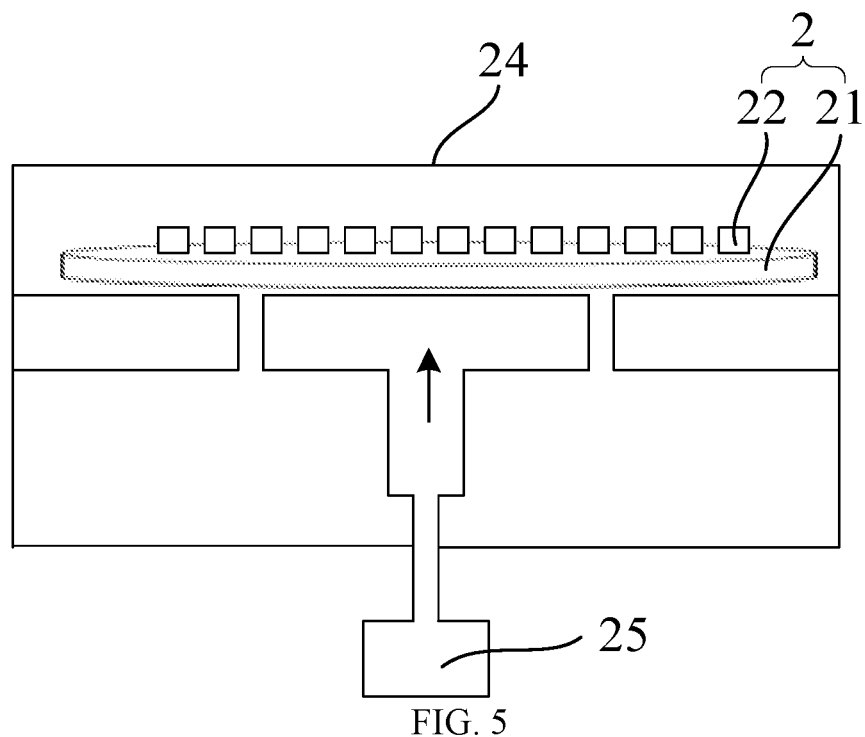
FIG. 5 is a schematic cross-sectional view of a reaction device according to an embodiment of the present application.

FIG. 4 is a flowchart of a method for manufacturing a semiconductor memory according to an embodiment of the present application; and FIG. 5 is a schematic cross-sectional view of a processing device according to an embodiment of the present application. Referring to FIGS. 4 and 5, the method for manufacturing a semiconductor device comprises the following steps.

Step 101: A portion to be processed 2 is provided and placed in a reaction chamber 24.

In this embodiment, there is a preset waiting time between adjacent process stations. The preset waiting time is between a minimum waiting time and a maximum waiting time, which are set in advance. The portion to be processed 2 is subjected to a preset process step after the preset waiting time. The thermal oxidation process and the cleaning process are performed within the preset waiting time.

In this embodiment, the portion to be processed 2 comprises a wafer 21 and a gate structure 22 located on the wafer 21. The gate structure 22 is a stacked structure composed of tungsten nitride, tungsten, and polycrystalline silicon stacked in sequence.

Before the portion to be processed is placed in the reaction chamber 24 for the thermal oxidation process, oxides may or may not have been generated on the surface of the gate structure 22, depending upon the environment of the portion to be processed 2 before entering the reaction device. In addition, the oxides generated by the exposure of the portion to be processed 2 to air environment are usually fluffy. Fluffy oxides will not affect the subsequent generation of compact oxides.

In this embodiment, before the portion to be processed 2 is placed in the reaction chamber 24, the portion to be processed 2 is subjected to a wafer electrical test. During the wafer electrical test, the portion to be processed 2 is usually exposed to air environment. In this case, fluffy oxides will be generated on the surface of the gate structure 22; after the preset waiting time has elapsed, the portion to be processed 2 is subjected to a capacitor manufacturing process.

The reaction device comprises a reaction chamber 24 and a gas pump 25. The portion to be processed 2 is placed in the reaction chamber 24. The reaction device is used at least to perform a thermal oxidation process and a cleaning process on the portion to be processed 2. For example, when the portion to be processed 2 needs to be preheated for the thermal oxidation process, heating the portion to be processed 2 may be realized by increasing the temperature of the reaction chamber 24 and opening the gas pump 25 so that the gas pump 25 feeds gas into the reaction chamber 24 and the flowing gas transfers the heat of the reaction chamber 24 to the surface of the portion to be processed 2.

In this embodiment, the gas pump 25 feeds gas toward a side of the wafer 21 away from the gate structure 22, which is helpful to avoid the concentration of heat on the gate structure 22, thereby ensuring the good performance of the portion to be processed 2.

In this embodiment, after the portion to be processed 2 is placed in the reaction chamber 24 and before it is subjected to a capacitor manufacturing process, it is subjected to a thermal oxidation process. The thermal oxidation process comprises step 102 and step 103, which will be specifically described below.

Step 102: The pressure of the reaction chamber 24 and the temperature of the portion to be processed 2 are adjusted.

In some embodiments, the temperature of the reaction chamber 24 is adjusted so that the temperature of the reaction chamber 24 increases to a first temperature. After the temperature of the reaction chamber 24 reaches the first temperature, the gas pump 25 is opened. The gas pump 25 feeds gas into the reaction chamber 24, and the flowing gas transfers the heat of the reaction chamber 24 to the surface of the portion to be processed 2 to heat the portion to be processed 2, so that the temperature of the portion to be processed 2 increases to the first temperature.

The feeding of gas by the gas pump 25 lasts for about 5 minutes, to ensure that the temperature of the portion to be processed 2 can increase to the first temperature.

In this embodiment, the first temperature is the process temperature for the thermal oxidation process. The first temperature is from 60° C. to 120° C., for example, 80° C., 95° C., and 110° C. Therefore, the influence of over-high temperature on the performance of the gate structure 22 can be avoided, and the normal progress of the thermal oxidation process can be ensured, so as to generate oxides with good uniformity.

In addition, during the heating of the portion to be processed 2, the reaction chamber 24 has a first pressure, the magnitude of the first pressure is determined by the flow rate of gas fed by the gas pump 25. In this embodiment, the first pressure is a standard atmospheric pressure, that is, 760 Torr.

Step 103: An oxygen supply gas is provided and a radio frequency power supply is turned on.

Figure 6:
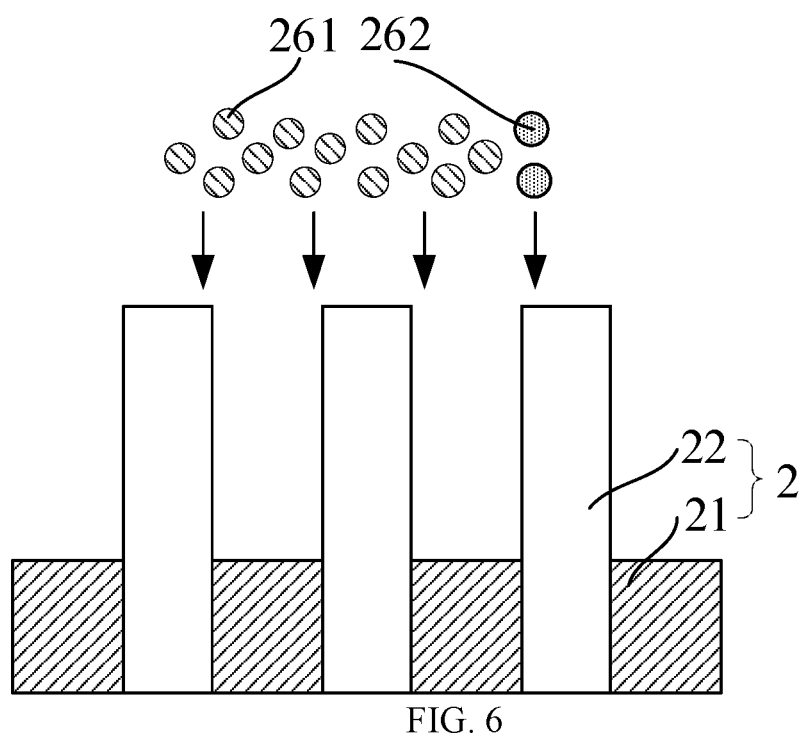
FIG. 6 is a first schematic cross-sectional structural view corresponding to a step of the method for manufacturing a semiconductor memory according to an embodiment of the present application.

Referring to FIG. 6, after the portion to be processed 2 is heated, an oxygen supply gas 261 is provided so that the pressure in the reaction chamber 24 increases from the first pressure to a second pressure; and after the pressure in the reaction chamber 24 increases to the second pressure, the radio frequency power supply is turned on; wherein, the oxygen supply gas 261 comprises $O_2$ or $O_3$.

It should be noted that, in the process of increasing the pressure in the reaction chamber 24, the temperature of the portion to be processed 2 is maintained at the first temperature; and after the pressure in the reaction chamber 24 increases to the second pressure, it should be maintained at the second pressure for about 15 minutes, to ensure the stability of both the temperature and pressure of the reaction chamber 24 and the flow rate of gas, and thus to ensure the stable progress of the thermal oxidation process.

In this embodiment, the second pressure is 900 Torr to 1500 Torr, for example, 1000 Torr, 1200 Torr, and 1400 Torr. In this way, it is helpful to further speed up the thermal oxidation process.

In this embodiment, a catalytic gas 262 is provided while providing the oxygen supply gas 261. In some embodiments, the oxygen supply gas 261 is oxygen and the flow rate of oxygen may be 13000 sccm; and the catalytic gas 262 is $N_2H_4$ and the flow rate of $N_2H_4$ may be 1300 sccm. In this way, it is helpful to speed up the thermal oxidation process.

Figure 7:
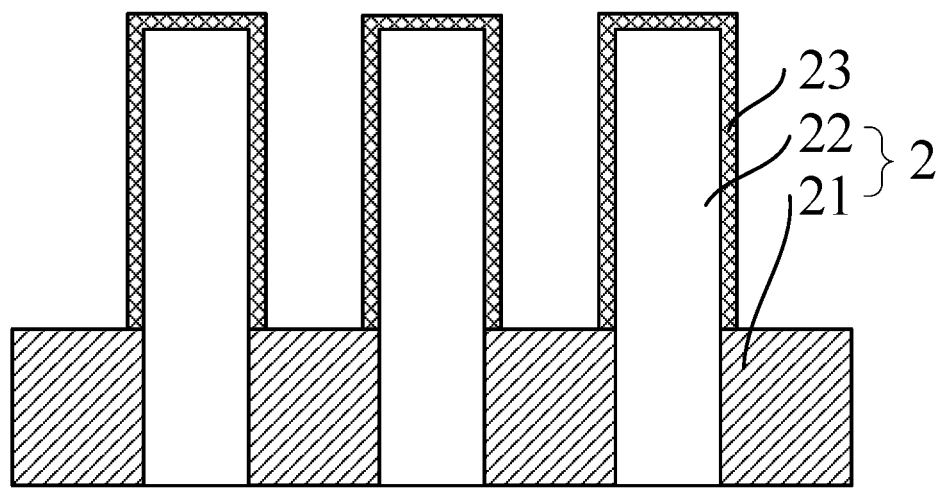
FIG. 7 is a second schematic cross-sectional structural view corresponding to a step of the method for manufacturing a semiconductor memory according to an embodiment of the present application.

Referring to FIGS. 6 and 7, in this embodiment, the turned-on radio frequency power supply has a first radio frequency power used to ionize the oxygen supply gas 261 to generate oxygen plasma. The oxygen plasma and the tungsten in the gate structure 22 have a thermal oxidation reaction to generate a compact oxide layer 23 that has good uniformity.

In this embodiment, the first radio frequency power is from 3600 W to 4400 W, for example, 3700 W, 3800 W, and 3900 W.

It should be noted that the thermal oxidation process has already started when the oxygen supply gas 261 is provided. Turning on the radio frequency power supply to ionize the oxygen supply gas 261 into plasma is to speed up the thermal oxidation process.

In this embodiment, after performing the thermal oxidation process and before entering the next process station for the capacitor manufacturing process, a cleaning process is performed on the portion to be processed 2. Ideally, the portion to be processed 2 may enter a next process station directly after the cleaning process is completed. The cleaning process comprises step 103 and step 104, which will be specifically described below.

Step 104: The temperature of the portion to be processed 2, the pressure in the reaction chamber 24, and the power of the radio frequency power supply are adjusted.

Figure 8:
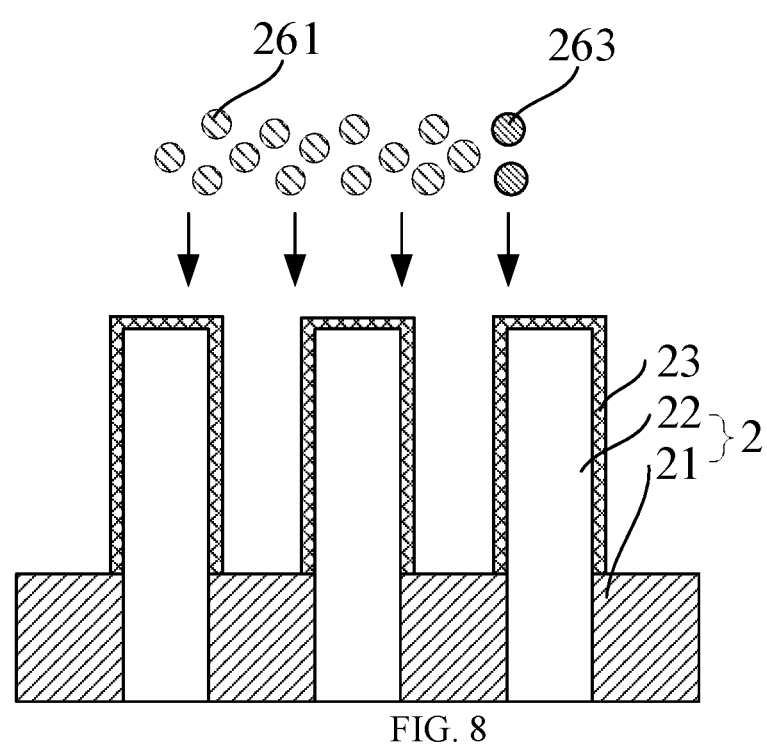
FIG. 8 is a third schematic cross-sectional structural view corresponding to a step of the method for manufacturing a semiconductor memory according to an embodiment of the present application.

Referring to FIGS. 5 and 8, after the oxide layer 23 with good uniformity is generated and before the portion to be processed 2 enters a next process station, the portion to be processed 2 needs to be cleaned to remove the oxide layer 23.

In this embodiment, the portion to be processed 2 has an opening. Before the cleaning process is performed, the bottom of the opening has oxides. Therefore, the oxides are removed by dry etching, which is helpful to preventing any residues between the adjacent gate structures 22 from being removed, thereby ensuring the insulation between the adjacent gate structures 22.

In some embodiments, the cleaning process comprises: adjusting the temperature of the portion to be processed 2, the pressure in the reaction chamber 24, and the power of the radio frequency power supply so that the temperature of the portion to be processed 2 decreases to a second temperature, the pressure in the reaction chamber 24 decreases to a third pressure, and the power of the radio frequency power supply decreases to a second radio frequency power. In this way, it is helpful to reduce the reaction rate of the cleaning process, so that the cleaning process can be stopped in time after the oxide layer 23 has been removed, thereby avoiding damages to the gate structure 22 by the cleaning process.

The second temperature is from 80° C. to 100° C., for example 85° C., 90° C., or 95° C.;

the third pressure is from 600 Torr to 800 Torr, for example 650 Torr, 700 Torr, or 750 Torr; and the second radio frequency power is from 3000 W to 4000 W, for example 3200 W, 3500 W, or 3800 W.

It should be noted that, at the end of the adjustment, this state needs to be maintained for about 15 minutes to ensure the stability of the temperature and pressure of the reaction chamber 24, the radio frequency power, and the flow rate of gas, thereby ensuring the stable progress of the subsequent cleaning process.

In this embodiment, the oxygen supply gas 261 is continuously fed during the cleaning process. The function of the oxygen supply gas 261 is to dilute the subsequently fed reaction gas 263 to reduce the reaction rate of the cleaning process, so that the cleaning process can be stopped in time after the oxide layer 23 has been removed, thereby avoiding damages to the gate structure 22 by the cleaning process.

Step 105: Part of the oxygen supply gas 261 is replaced with the reaction gas 263.

After the pressure in the reaction chamber 24 becomes stable, part of the oxygen supply gas 261 is replaced with the reaction gas 263. The reaction gas 263 is used to remove the oxide layer 23. In this way, it is helpful to reduce the influence of the introduction of the reaction gas 263 on the stability of the pressure in the reaction chamber 24.

In this embodiment, the material for the oxide layer 23 is tungsten oxide, the oxygen supply gas 261 comprises $O_2$ or $O_3$, and the reaction gas 263 comprises fluorine-containing gas or ammonia gas. In some embodiments, the oxygen supply gas 261 is oxygen, and the reaction gas 263 is $CF_4$. Before the gas replacement, the flow rate of the oxygen supply gas is 4000 sccm; and after the gas replacement, the flow rate of the oxygen supply gas 261 is 3960 sccm, and the flow rate of the reaction gas 263 is 40 sccm.

It should be noted that, in other embodiments, the reaction gas is ammonia gas.

Step 106: A purging process is performed.

After the cleaning process and before the preset process step, a purging process is performed. The purging process is used to remove impurities from the surface of the portion to be processed 2 so that the portion to be processed 2 entering a next station has good performance.

In this embodiment, the purging process comprises: purging the portion to be processed 2 with an inert gas, the difference between the temperature of the inert gas and the second temperature being less than a preset temperature value. Specifically, after the cleaning process, the temperature of the reaction chamber 24 is maintained at the second temperature, the pressure in the reaction chamber 24 is maintained at the third pressure, and nitrogen is provided to purge the surface of the portion to be processed 2. In this way, it is helpful to avoid a large difference between the temperature of the inert gas and the temperature of the portion to be processed 2, and then to avoid damages, such as explosion, that may be caused by a large temperature difference, thereby ensuring the good performance of the portion to be processed 2.

In this embodiment, before performing the preset process step, a thermal oxidation process is performed on the portion to be processed 2, so that an oxide layer 23 with good uniformity is generated on the surface of the portion to be processed 2. Since the oxide layer 23 is quite compact, it can protect the portion to be processed 2 and prevent the portion to be processed 2 from being further oxidized before the cleaning process. In addition, since the oxide layer 23 on the surface of the portion to be processed 2 has good uniformity, the oxides can be removed by controlling the progress of the cleaning process without damaging the portion to be processed 2.

It may be understood by a person of ordinary skill in the art that the above-mentioned implementations are specific embodiments for realizing the present application, and in actual applications, various changes may be made to the form and details without departing from the spirit and scope of the present application. Any person skilled in the art may make their own changes and modifications without departing from the spirit and scope of the present application. Therefore, the protection scope of the present application shall be defined by the claims.

What is claimed is:

1. A method for manufacturing a semiconductor memory, comprising:
    providing a portion to be processed, and performing a preset process step on the portion to be processed at least after a minimum waiting time;
    before performing the preset process step, performing a thermal oxidation process on the portion to be processed; and
    before performing the preset process step, performing a cleaning process, the cleaning process being used to remove oxides from the surface of the portion to be processed, the oxides being wholly or partly generated by the thermal oxidation process;
    wherein the thermal oxidation process comprises: heating the portion to be processed, so that the temperature of the portion to be processed increases to a first temperature, wherein a first pressure is formed in a reaction chamber during the heating process; after the heating process, maintaining the temperature of the portion to be processed at the first temperature, and providing an oxygen supply gas so that the pressure in the reaction chamber increases from the first pressure to a second pressure; and after the pressure in the reaction chamber increases to the second pressure, turning on a radio frequency power supply; wherein the second pressure is from 900 Torr to 1500 Torr.

2. The method according to claim 1, wherein the thermal oxidation process is performed by using oxygen plasma.

3. The method according to claim 2, wherein a first radio frequency power for generating the oxygen plasma is from 3500 W to 4400 W.

4. The method according to claim 1, wherein a process temperature for the thermal oxidation process is from 60° C. to 120° C.

5. The method according to claim 1, wherein the cleaning process comprises: providing the oxygen supply gas, and adjusting the temperature of the portion to be processed, the pressure in the reaction chamber, and the power of the radio frequency power supply so that the temperature of the portion to be processed decreases to a second temperature, the pressure in the reaction chamber decreases to a third pressure, and the power of the radio frequency power supply decreases to a second radio frequency power; and after the adjustment, maintaining the pressure in the reaction chamber at the third pressure, and replacing part of the oxygen supply gas with a reaction gas, the reaction gas being used to remove the oxides.

6. The method according to claim 5, wherein the material for the portion to be processed comprises tungsten, the oxides are tungsten oxide, the oxygen supply gas comprises $O_2$ or $O_3$, and the reaction gas comprises a fluorine-containing gas or ammonia gas.

7. The method according to claim 5, wherein, after performing the cleaning process and before performing the preset process step, a purging process is performed, the purging process comprises: purging the surface of the portion to be processed with an inert gas, the difference between the temperature of the inert gas and the second temperature being less than a preset temperature value.

8. A method for manufacturing a semiconductor memory, comprising:
    providing a portion to be processed, and performing a preset process step on the portion to be processed at least after a minimum waiting time;
    before performing the preset process step, performing a thermal oxidation process on the portion to be processed; and
    before performing the preset process step, performing a cleaning process, the cleaning process being used to remove oxides from the surface of the portion to be processed, the oxides being wholly or partly generated by the thermal oxidation process;
    wherein the thermal oxidation process comprises: heating the portion to be processed, so that the temperature of the portion to be processed increases to a first temperature, wherein a first pressure is formed in a reaction chamber during the heating process; after the heating process, maintaining the temperature of the portion to be processed at the first temperature, and providing an oxygen supply gas so that the pressure in the reaction chamber increases from the first pressure to a second pressure; and after the pressure in the reaction chamber increases to the second pressure, turning on a radio frequency power supply;
    wherein, after the heating process, the oxygen supply gas and a catalytic gas are provided; wherein the oxygen supply gas is $O_2$ and the flow rate of the oxygen supply gas is 13000 sccm, and the catalytic gas is $N_2H_4$ and the flow rate of the catalytic gas is 1300 sccm.

9. A method for manufacturing a semiconductor memory, comprising:
    providing a portion to be processed, and performing a preset process step on the portion to be processed at least after a minimum waiting time;
    before performing the preset process step, performing a thermal oxidation process on the portion to be processed; and
    before performing the preset process step, performing a cleaning process, the cleaning process being used to remove oxides from the surface of the portion to be processed, the oxides being wholly or partly generated by the thermal oxidation process;
    wherein the thermal oxidation process comprises: heating the portion to be processed, so that the temperature of the portion to be processed increases to a first temperature, wherein a first pressure is formed in a reaction chamber during the heating process; after the heating process, maintaining the temperature of the portion to be processed at the first temperature, and providing an oxygen supply gas so that the pressure in the reaction chamber increases from the first pressure to a second pressure; and after the pressure in the reaction chamber increases to the second pressure, turning on a radio frequency power supply;
    wherein the cleaning process comprises: providing the oxygen supply gas, and adjusting the temperature of the portion to be processed, the pressure in the reaction chamber, and the power of the radio frequency power supply so that the temperature of the portion to be processed decreases to a second temperature, the pressure in the reaction chamber decreases to a third pressure, and the power of the radio frequency power supply decreases to a second radio frequency power;
    and after the adjustment, maintaining the pressure in the reaction chamber at the third pressure, and replacing part of the oxygen supply gas with a reaction gas, the reaction gas being used to remove the oxides;
    wherein the material for the portion to be processed comprises tungsten, the oxides are tungsten oxide, the oxygen supply gas comprises $O_2$ or $O_3$, and the reaction gas comprises a fluorine-containing gas or ammonia gas;

wherein the oxygen supply gas is oxygen and the flow rate of the oxygen supply gas is 3960 sccm; and the reaction gas is $CF_4$ and the flow rate of the reaction gas is 40 sccm.

\* \* \* \* \*